United States Patent
Satou et al.

(10) Patent No.: US 7,123,054 B2
(45) Date of Patent: Oct. 17, 2006

(54) SEMICONDUCTOR INTEGRATED CIRCUIT DEVICE HAVING AN ESD PROTECTION UNIT

(75) Inventors: Youichi Satou, Kawasaki (JP); Toshikazu Sei, Kawasaki (JP); Akira Yamaguchi, Kitaadachi-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 10/869,328

(22) Filed: Jun. 15, 2004

(65) Prior Publication Data

US 2005/0047042 A1 Mar. 3, 2005

(30) Foreign Application Priority Data

Aug. 27, 2003 (JP) .............................. 2003-209073

(51) Int. Cl.
H03K 19/0175 (2006.01)
H03K 19/094 (2006.01)
H03K 17/16 (2006.01)

(52) U.S. Cl. .......................... 326/82; 326/83; 326/89; 327/387; 327/389; 327/405

(58) Field of Classification Search ............ 326/82–83, 326/89; 327/387, 389, 405
See application file for complete search history.

(56) References Cited

U.S. PATENT DOCUMENTS

| | | | | |
|---|---|---|---|---|
| 5,475,333 | A * | 12/1995 | Kumagai | 327/530 |
| 5,596,295 | A * | 1/1997 | Ueno et al. | 327/170 |
| 5,612,582 | A * | 3/1997 | Shichi et al. | 307/130 |
| 6,249,414 | B1 | 6/2001 | Lee et al. | |
| 6,356,138 | B1 * | 3/2002 | Ohshima | 327/434 |
| 6,433,979 | B1 | 8/2002 | Yu | |

FOREIGN PATENT DOCUMENTS

| | | |
|---|---|---|
| JP | 7-240510 | 9/1995 |
| JP | 2001-308282 | 2/2001 |
| WO | 02/075891 A1 | 9/2002 |

OTHER PUBLICATIONS

"GGSCRs: GGNMOS Triggered Silicon Controlled Rectifiers for ESD Protection in Deep Sub-Micron CMOS Process" by C. Russ, M. Mergens, K.Verhaege, J. Armer, P. Jozwiak, G. Kolluri, L. Avery Published in 2001.*
Notification of Reasons for Rejection mailed on Oct. 3, 2005 in connection with the related Japanese Patent Application No. 2003-209073. English translation of the Office Action is enclosed.
Russ, et al., "GGSCRs: GGNMOS Triggered Silicon Controlled Rectifiers for ESD Protection in Deep Sub-Micron CMOS Proceses," EOS/ESD Symposium, 2001. Sep. 9-13, 2001.

* cited by examiner

*Primary Examiner*—James Cho
*Assistant Examiner*—Jason Crawford
(74) *Attorney, Agent, or Firm*—DLA Piper US LLP

(57) ABSTRACT

A semiconductor integrated circuit device includes a semiconductor integrated circuit formed in a semiconductor chip, and a switching element that is formed in the semiconductor chip and has a current path whose one end and the other end are both connected to the semiconductor integrated circuit. The switching element receives a control signal produced by a control circuit and causes a current to flow from the one end to the other end of the current path by a bipolar operation. The semiconductor integrated circuit device further includes the control circuit that is formed in the semiconductor chip and configured to control a conductive/nonconductive state of the current path of the switching element.

16 Claims, 4 Drawing Sheets

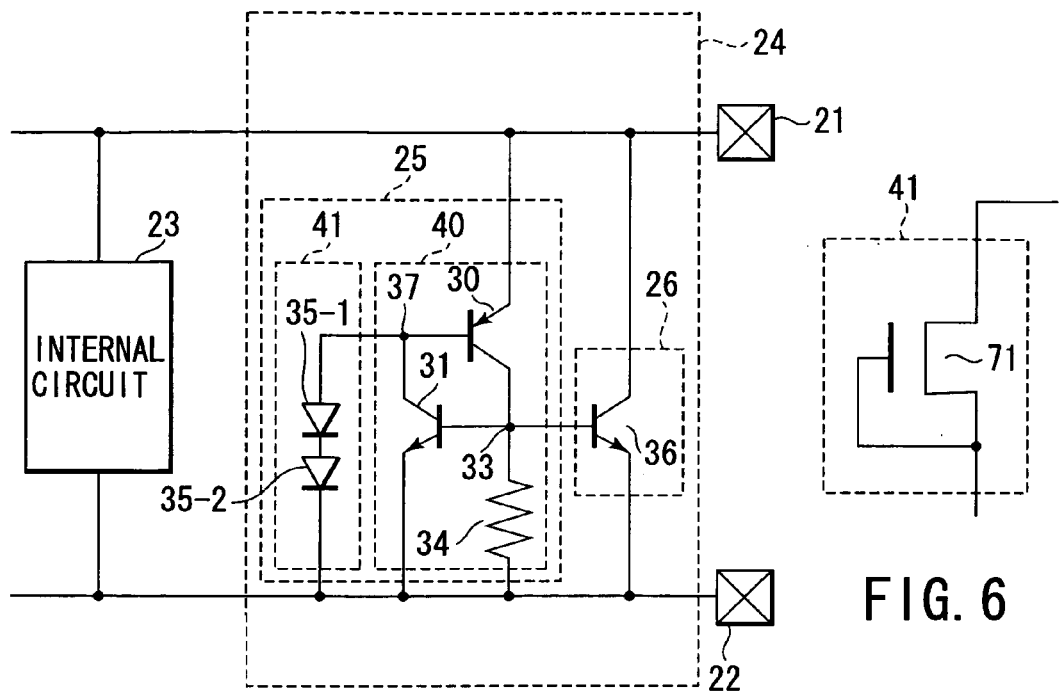
FIG. 5
FIG. 6
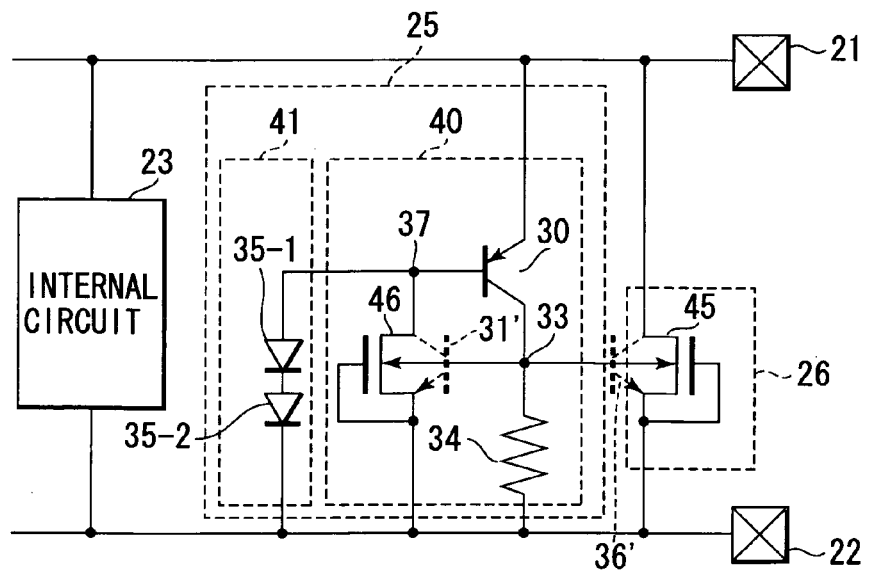
FIG. 7

SEMICONDUCTOR INTEGRATED CIRCUIT DEVICE HAVING AN ESD PROTECTION UNIT

CROSS-REFERENCE TO RELATED APPLICATIONS

This application is based upon and claims the benefit of priority from the prior Japanese Patent Application No. 2003-209073, filed Aug. 27, 2003, the entire contents of which are incorporated herein by reference.

BACKGROUND OF THE INVENTION

1. Field of the Invention

The present invention relates generally to a semiconductor integrated circuit device such as an IC (Integrated Circuit) and an LSI (Large Scale Integrated Circuit), and more particularly to a semiconductor integrated circuit device having an ESD (Electrostatic Discharge) protection circuit for protecting an internal circuit from ESD.

2. Description of the Related Art

If ESD occurs, for example, while a semiconductor integrated circuit device is being conveyed by a machine, a high voltage of, e.g. about several-hundred V to several-thousand V is applied to the semiconductor integrated circuit device in a very short time. This may lead to destruction of an internal circuit (semiconductor integrated circuit). In order to protect the semiconductor integrated circuit device such as an IC or an LSI from ESD, a variety of ESD protection circuits have been proposed (see, for instance, Jpn. Pat. Appln. KOKAI Publication No. 7-240510, U.S. Pat. No. 6,249,414, and EOS/ESD SYMPOSIUM 2001, 1A.3 "GGSCRs: GGNMOS Triggered Silicon Controlled Rectifiers for ESD Protection in Deep Sub-Micron CMOS Processes"). An ESD protection circuit is provided in the semiconductor integrated circuit device, thereby to release a high voltage, which is applied to the internal circuit due to ESD, and to protect the internal circuit from destruction.

Referring to FIG. 1 and FIG. 2, a prior-art ESD protection circuit is described.

FIG. 1 is a circuit diagram depicting the prior-art ESD protection circuit. As is shown in FIG. 1, a pad 11 and a pad 12 are connected to an internal circuit 10 that is to be protected. The ESD protection circuit comprises a thyristor (SCR) circuit 13 for releasing an excessive ESD current, and a control circuit 15 that controls the on/off of the thyristor circuit 13.

The thyristor circuit 13 has an anode connected to the pad 11 and a cathode connected to the pad 12. The thyristor circuit 13 comprises a PNP bipolar transistor 16, an NPN bipolar transistor 17 and a resistor element 18. The PNP bipolar transistor 16 has an emitter connected to the pad 11, a base connected to a collector of the NPN bipolar transistor 17, and a collector connected to the control circuit 15. The NPN bipolar transistor 17 has a base connected to the control circuit 15, and an emitter connected to the pad 12. The resistor element 18 has one end connected to the control circuit 15, and the other end connected to the pad 12.

The control circuit 15 comprises a GG (Gate Grounded) NMOS transistor 19 and a resistor element 20. The GGNMOS transistor 19 has a drain connected to the pad 11, and a gate and a source both connected to the thyristor circuit 13. The resistor element 20 has one end connected to the gate and source of the NMOS transistor 19, and the other end connected to the pad 12.

The operation of the prior-art ESD protection circuit will now be described referring to FIG. 2. FIG. 2 is a graph showing voltage/current characteristics of the GGNMOS transistor 19 shown in FIG. 1. The abscissa in FIG. 2 indicates a voltage V1 that is applied between the drain of the GGNMOS transistor 19, on the one hand, and the source and gate of the GGNMOS transistor 19, on the other hand. The ordinate indicates a current I1 that flows between the drain and the source and gate of the GGNMOS transistor 19 and flows through the thyristor circuit 13.

If a high voltage due to ESD is applied between the pad 11 and pad 12, the high voltage due to ESD is applied to the drain of the GGNMOS 19. Then, as shown in FIG. 2, after the voltage reaches a trigger voltage Vt1, it drops to a hold voltage Vh due to a snap-back characteristic. Thereafter, breakdown occurs between the drain of the GGNMOS transistor 19 and the substrate, and a parasitic NPN bipolar transistor of the GGNMOS transistor 19 operates and a current flows with a sharp increase. Consequently, a base current flows to the base of the NPN bipolar transistor 17 of thyristor circuit 13, thereby turning on the thyristor circuit 13 and a large current due to ESD flows between the anode and cathode of the thyristor circuit 13. By this operation, the ESD voltage applied between the pad 11 and pad 12 is released through the thyristor circuit 13. Therefore, the ESD voltage is not applied to the internal circuit 10, and the internal circuit 10 is protected.

As is shown in FIG. 2, in order to cause a large current to flow through the thyristor current 13, a sufficiently large current needs to be made to flow before the voltage V1 exceeds a gate breakdown voltage Vg of the internal circuit. However, with present-day miniaturization of an LSI, etc., which constitutes the internal circuit 10, the thickness of the gate oxide film of the MOS transistor in the LSI has decreased more and more. Consequently, the gate breakdown voltage Vg has decreased more and more.

Since the thyristor 13 comprises the PNP bipolar transistor 16 and NPN bipolar transistor 17, the value of on-state resistance is high. As a result, before a large current is let to flow, the voltage V1 exceeds the gate breakdown voltage Vg. Moreover, in order to cause a sufficient current to flow before the voltage V1 exceeds the gate breakdown voltage Vg, it is necessary to increase the size of each bipolar transistor 16, 17 and to decrease the on-state resistance. This, however, leads to an increase in chip size and a rise in manufacturing cost.

BRIEF SUMMARY OF THE INVENTION

A semiconductor integrated circuit device according to an aspect of the invention comprises a semiconductor integrated circuit formed in a semiconductor chip; a switching element that is formed in the semiconductor chip and has a current path whose one end and the other end are both connected to the semiconductor integrated circuit, the switching element receiving a control signal and causing a current to flow from the one end to the other end of the current path by a bipolar operation; and a control circuit that is formed in the semiconductor chip and configured to control a conductive/non-conductive state of the current path of the switching element, the control circuit producing, when a voltage across both ends of the current path exceeds a predetermined voltage value, the control signal that renders the current path of the switching element conductive, and rendering the current path of the switching element non-conductive when the voltage across both ends of the current path does not exceed the predetermined voltage value.

BRIEF DESCRIPTION OF THE SEVERAL VIEWS OF THE DRAWING

FIG. 5 is a circuit diagram showing an ESD protection circuit according to a first embodiment of the present invention;

FIG. 6 is a circuit diagram showing an example of a trigger circuit 41;

FIG. 7 is a circuit diagram showing an ESD protection circuit according to a second embodiment of the present invention;

DETAILED DESCRIPTION OF THE INVENTION

Figure 1:
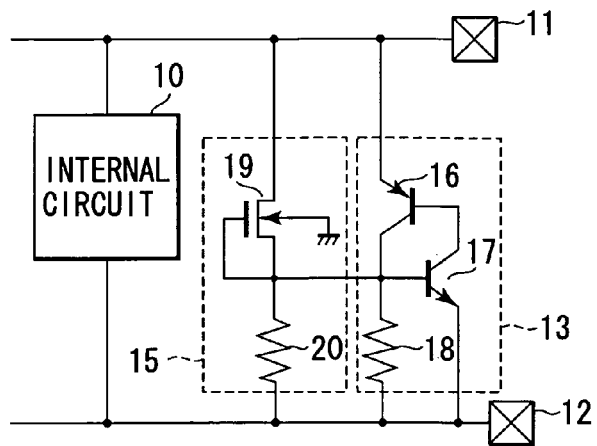
FIG. 1 is a circuit diagram showing a prior-art ESD protection circuit.

Embodiments of the present invention will now be described with reference to the accompanying drawings. In the description below, common parts are denoted by like reference numerals throughout the drawings.

Figure 4:
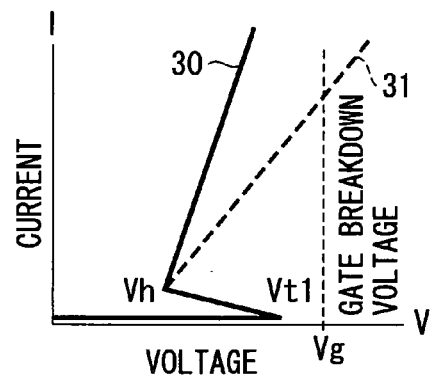
FIG. 4 is a graph showing voltage/current characteristics of the ESD protection circuit shown in FIG. 3.
Figure 3:
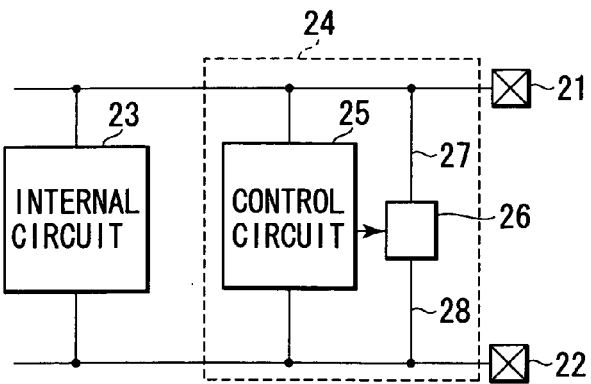
FIG. 3 is a circuit diagram schematically showing an ESD protection circuit according to the present invention.

To begin with, the outline of an ESD protection circuit according to the present invention is described referring to FIG. 3 and FIG. 4. FIG. 3 is a circuit diagram schematically showing an example of the ESD protection circuit according to the invention.

As is shown in FIG. 3, an internal circuit (semiconductor integrated circuit) to be protected is formed in a semiconductor chip. For example, a first pad 21 and a second pad 22 are connected as external terminals to the internal circuit 23. An ESD protection circuit 24 is connected between the first pad 21 and second pad 22.

The ESD protection circuit 24 includes a control circuit 25 and a switching element 26. The control circuit 25 has one end connected to the first pad 21 and the other end connected to the second pad 22. The switching element 26 has a current path. One end 27 of the current path is connected to the first pad 21, and the other end 28 connected to the second pad 22. The current path of the switching element 26 is on/off controlled by a control signal that is supplied from the control circuit 25. In the on-state, the switching element 26 releases a voltage through its current path by a bipolar operation.

Figure 2:
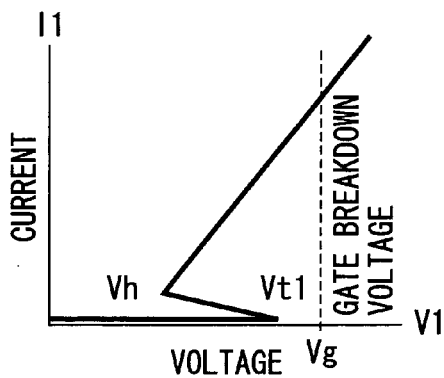
FIG. 2 is a graph showing voltage/current characteristics of the prior-art ESD protection circuit shown in FIG. 1.

The operation of the ESD protection circuit shown in FIG. 3 is described referring to FIG. 4. FIG. 4 is a graph showing voltage/current characteristics of the ESD protection circuit 24 shown in FIG. 3. In FIG. 4, the abscissa indicates a voltage V that is applied to the ESD protection circuit 24, and the ordinate indicates a current I that flows through the ESD protection circuit 24. In addition, in FIG. 4, a solid line 30 indicates voltage/current characteristics of the ESD protection circuit 24 shown in FIG. 3, and a broken line 31 indicates the voltage/current characteristics of the ESD protection circuit shown in FIG. 2.

When no high voltage due to ESD is applied between the first pad 21 and second pad 22, the ESD protection circuit 24 does not operate. Hence, the operation of the ESD protection circuit 24 does not affect the operation of the internal circuit 23.

On the other hand, if a high voltage due to ESD is applied between the first pad 21 and second pad 22 and it reaches a predetermined voltage value Vt1, the control circuit 25 detects the reaching to value Vt1 and starts activating the ESD protection circuit 24.

The voltage value Vt1 is a trigger voltage at which the ESD protection circuit 24 begins to operate. In this example, the control circuit 25 detects the applied ESD voltage. In the control circuit 25, once the voltage V reaches the trigger voltage Vt1, the voltage V between the first pad 21 and second pad 22 is decreased to a hold voltage Vh due to a snap-back characteristic. Then, the control circuit 25 outputs a control signal to the switching element 26, thereby to render the current path of the switching element 26 conductive.

Thus, the current path of the switching element 26 is rendered conductive by the control signal. In this conductive state, if a high voltage due to ESD is applied to either one end 27 or the other end 28 of the switching element 26, the switching element 26 is turned on and a current is let to flow between the first pad 21 and second pad 22 by a bipolar operation. Thereby, the high voltage due to ESD is released to one of the first pad 21 and second pad 22.

The above-described operation prevents the high voltage due to ESD from being applied to the internal circuit 23. In addition, the switching element 26 causes a current to flow through its current path by a bipolar operation. The high voltage can quickly be released to one of the first and second pads 21 and 22. The internal circuit 23 can be protected from the high voltage due to ESD.

As has been described above, the high voltage caused by ESD can be released by making use of a current that is let to flow by the bipolar operation of the switching device 26. This can decrease the on-state resistance of the ESD protection circuit 24. As a result, as shown in FIG. 4, a large current can be caused to flow, without exceeding the gate breakdown voltage Vg, as shown in FIG. 4. Therefore, even in the case of the miniaturized internal circuit 23, the gate insulation film of the transistor in the internal circuit 23 cannot be destroyed.

Moreover, the ESD protection circuit 24 can be composed of a single switching element 26. Thus, the chip size of the ESD protection circuit can be reduced.

It should suffice if the control circuit 25 detects an ESD voltage and to output a control signal with such a low current value as to render the switching element 26 conductive. It is thus possible to reduce the chip size of the control circuit 25. Accordingly, the chip size of the entirety of the ESD protection circuit 24 can be reduced. The current value of the control signal is, for instance, several mA (milliampere).

[First Embodiment]

A first embodiment of the present invention will now be described with reference to FIG. 5. In the description below, the parts that have already described are not described, and different parts are described in detail.

FIG. 5 is a circuit diagram showing an ESD protection circuit according to the first embodiment of the invention. As is shown in FIG. 5, an ESD protection circuit 24 comprises a switching element 26 and a control circuit 25.

An NPN bipolar transistor 36 is applied to the switching element 26. The NPN bipolar transistor 36 has a base connected to the control circuit 25, an emitter connected to the second pad 22, and a collector connected to the first pad 21.

The control circuit 25 comprises a thyristor circuit 40 that controls the base current to the NPN bipolar transistor 36, and a trigger circuit 41 for operating the thyristor circuit 40.

The thyristor circuit 40 comprises a PNP bipolar transistor 30, an NPN bipolar transistor 31 and a resistor element 34. The PNP bipolar transistor 30 has a base connected to a collector 31 of the NPN bipolar transistor 31. The base of the transistor 31 is connected to the collector of the transistor 30. The emitter of the transistor 30 is connected to the first pad 21, and the emitter of the transistor 31 is connected to the second pad 22. A node between the base of the transistor 30 and the collector of the transistor 31 is connected to the second pad 22 via the trigger circuit 41. A node 33 between the base of the transistor 31 and the collector of the transistor 30 is connected to the second pad 22 via the resistor element 34. The node 33 is also connected to the base of the transistor 36 that functions as the switching element 26.

For example, the trigger circuit 41 comprises a first diode 35-1 and a second diode 35-2, which are connected in series between the node 37 and the second pad 22. The anode of the first diode 35-1 is connected to the node 37, and the cathode of the first diode 35-1 is connected to the anode of the second diode 35-2. The cathode of the second diode 35-2 is connected to the second pad 22.

Next, the operation of the ESD protection circuit shown in FIG. 5 is described. In the following description of the operation, the voltage/current characteristics of the ESD protection circuit are not described since they are similar to those shown in FIG. 4.

When an ESD voltage is not applied between the first pad 21 and second pad 22, the ESD protection circuit 24 does not operate.

On the other hand, if a high potential due to ESD is applied to the first pad 21 and a high voltage occurs between the first pad 21, which is a high potential side, and the second pad 22, which is a low potential side, the trigger circuit 41 detects the occurrence of the high voltage. Upon detecting the occurrence of the high voltage, the trigger circuit 41 produces a forward current toward the second pad 22. This forward current is a trigger signal (current) for activating the thyristor circuit 40. If the thyristor circuit 40 detects the trigger signal, the thyristor circuit 40 is turned on.

If the thyristor circuit 40 is turned on, it produces a control signal (control current in this example). The control signal is supplied from the node 33 to the base of the transistor 36. The control signal serves as the base signal to the transistor 36 and renders the NPN bipolar transistor 36 conductive. Since the control signal produced by the thyristor circuit 40 is the base current to the transistor 36, it should suffice if the current value of the control signal is about several mA, for instance.

If an ESD voltage is applied between the collector and emitter of the NPN bipolar transistor 36 in its on-state, the collector/emitter current path of the NPN bipolar transistor 36 is made completely conductive. Thus, current flows between the collector and emitter of the NPN bipolar transistor 36, and the high potential applied to the first pad 21 is released to the second pad 22.

By the above-described operation, the internal circuit 23 can be protected from ESD voltage.

As has been described above, since the ESD voltage is released through the single NPN bipolar transistor 36, the size of the ESD protection circuit 24 can be decreased and the manufacturing cost of the semiconductor IC device can be reduced.

Further, making use of the collector-emitter current of the bipolar transistor 36, the high voltage applied due to ESD is released. Thus, compared to the thyristor, the on-state resistance can be reduced. Therefore, it is possible to alleviate such a problem that the gate breakdown voltage Vg is exceeded.

The thyristor circuit 40 supplies the base current that renders the NPN bipolar transistor 36 conductive. Although the thyristor circuit 40 itself may have the ability to release voltage, the transistor 36 performs the main function of releasing voltage. For this reason, the thyristor circuit 40 may simply function to supply the base current, and there is no need to increase the current value. This can reduce the chip area of the thyristor circuit 40, and an increase in chip size can advantageously be suppressed. The thyristor circuit 40 is used to output the control signal to the gate of the transistor 36. Since a high-power control signal is not needed, the chip size and manufacturing cost of the thyristor circuit 40 can be reduced.

In the above-described embodiment, the trigger circuit 41 comprises the first and second diodes 35-1 and 35-2. The structure of the trigger circuit 41 is not limited to this.

For example, as shown in FIG. 6, the trigger circuit 41 may comprise a diode-connected N-channel MOS transistor 71 that has a drain connected to the thyristor circuit 40, and a gate and a source both connected to the second pad 22.

[Second Embodiment]

A second embodiment of the present invention will now be described referring to FIG. 7. In the description below, the parts common to those in the first embodiment are not described, and different parts are described in detail.

FIG. 7 is a circuit diagram showing an ESD protection circuit according to a second embodiment of the present invention. As shown in FIG. 7, in this embodiment, a parasitic bipolar transistor 36' within an N-channel MOS transistor 45 is used as the switching element 26. The MOS transistor 45 has a drain connected to the first pad 21, a source and a drain both connected to the second pad 22, and a backgate connected to the node 33.

Further, in this example, a parasitic bipolar transistor 31' within an N-channel MOS transistor 46 is used for the NPN bipolar transistor 31 of the thyristor circuit 40. The MOS transistor 46 has a gate and a source both connected to the second pad 22, a backgate connected to the node 33, and a drain connected to the node 37.

The description of the operation of the ESD protection circuit 24 according to the second embodiment is omitted since this operation is the same as that of the ESD protection circuit 24 according to the first embodiment.

According to the second embodiment, the same advantages as with the first embodiment can be obtained. Further, the parasitic bipolar transistor within the MOS transistor is used as the switching element 26. It is thus possible to fabricate the ESD protection circuit 24 by MOS LSI process technology. Accordingly, fabrication steps can commonly be used, and the manufacturing cost and chip size can be reduced. These advantages are described in greater detail, referring to examples of layout in Modification 1 and Modification 2 below.

[Modification 1]

Figure 8:
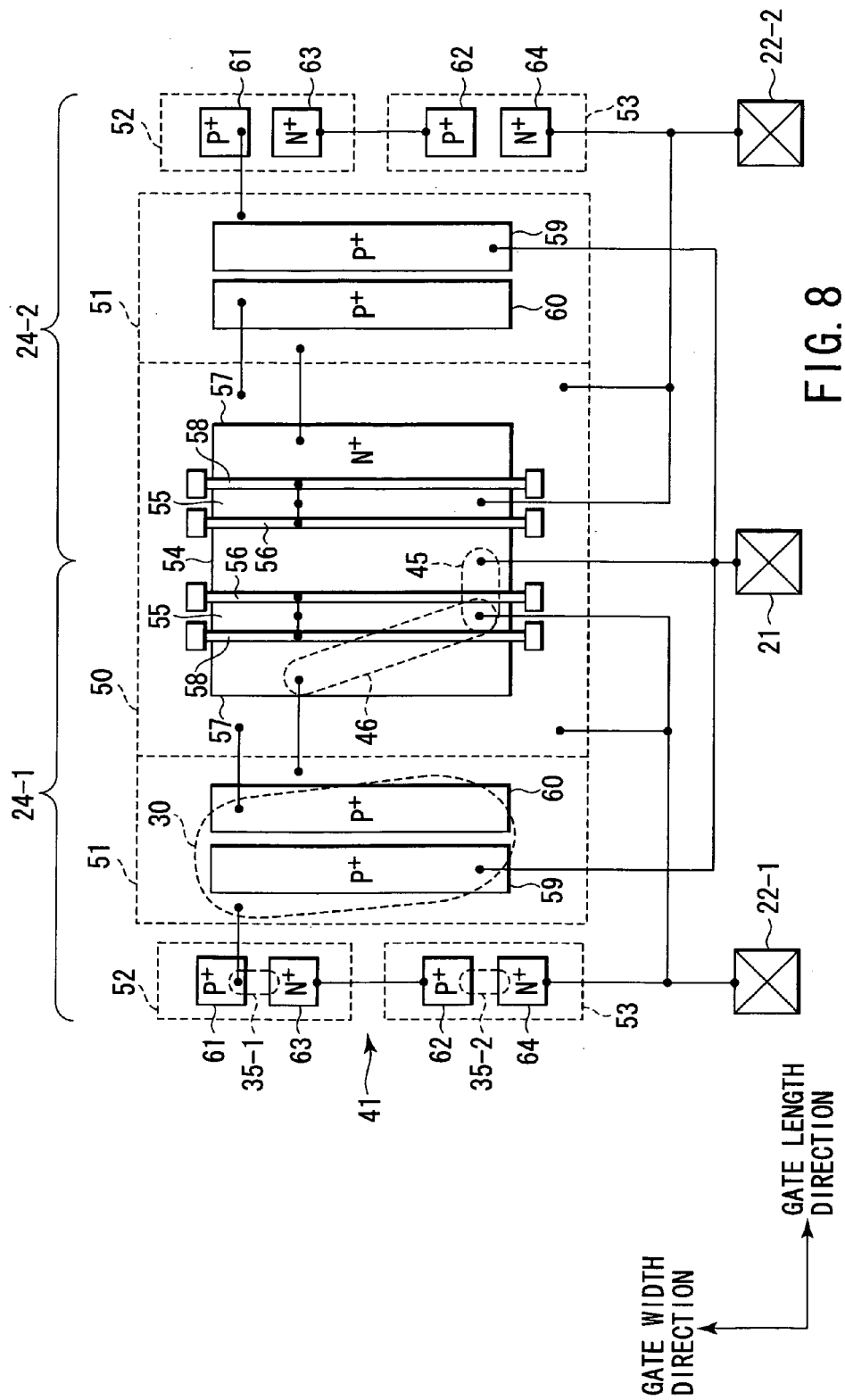
FIG. 8 shows a first layout of the ESD protection circuit shown in FIG. 7.

An ESD protection circuit according to Modification 1 will now be described referring to FIG. 8. FIG. 8 is a plan view illustrating an example of layout of the ESD protection circuit according to Modification 1. In this example of layout, the circuit shown in FIG. 7 is arranged on an LSI. In the description below, the parts common to those of the second embodiment are not described, and different parts are described in detail.

As is shown in FIG. 8, a first ESD protection circuit 24-1 and a second ESD protection circuit 24-2 are arranged on the LSI so as to share the first pad 21. One of the protection circuits 24-1 and 24-2 corresponds to the protection circuit shown in FIG. 7.

To begin with, the layout of the first ESD protection circuit 24-1 is described. The first ESD protection circuit 24-1 comprises an N-channel MOS transistor 45, which is disposed on a P-type substrate 50 and constitutes the switching element 26, an N-channel MOS transistor 46 and a PNP bipolar transistor 30, which constitute the thyristor circuit 40, and first and second diodes 35-1 and 35-2 which constitute the trigger circuit 41.

An $N^+$ drain 54 of the MOS transistor 45 is formed in the P-type substrate 50. An $N^+$ source 55 of the MOS transistor 45 is connected to the second pad 22-1. A gate 56 of the MOS transistor 45 is connected to the source 55 and formed in the P-type substrate 50. The MOS transistor 46 has a source that is shared with the source 55 of the MOS transistor 45. An $N^+$ drain 57 of the MOS transistor 46 is formed in the P-type substrate 50 and connected to an N-type well 51. A gate 58 of the MOS transistor 46 is connected to the source 55.

The PNP bipolar transistor 30 is disposed on the well 51 that is provided on an outer periphery of the MOS transistor 46. The PNP bipolar transistor 30 has a base that corresponds to the N-type well 51. A collector 59 and an emitter 60 of the transistor 30 are formed in the N-type well 51. The collector 59 is connected to the first pad 21, and the emitter 60 is connected to the P-type substrate 50, that is, the backgate of the MOS transistor 45, 46.

The diodes 35-1 and 35-2 are disposed on N-type wells 52 and 53 that are provided on an outer periphery of the transistor 30. The diode 35-1 has a cathode that corresponds to the N-type well 52. An anode 61 is formed in the N-type well 52. The anode 61 is connected to the N-type well 51, i.e. the base of the transistor 30. The diode 35-2 has a cathode that corresponds to the N-type well 53. An anode 62 of the diode 35-2 is formed in the N-type well 53. The anode 62 is connected to the cathode of the diode 35-1, i.e. the N-type well 52. In FIG. 8, an $N^+$ region 63 formed in the N-type well 52 is a contact region for wiring contact. The cathode of the diode 35-2, that is, the N-type well 53, is connected to the second pad 22-1 via the $N^+$ contact region 64. This configuration is similar to the second ESD protection circuit 24-2.

The operation of the ESD protection circuit according to Modification 1 is the same as that of the second embodiment, and a description thereof is omitted here.

According to Modification 1, the MOS transistor 45 and the MOS transistor 46 that constitutes the thyristor circuit are disposed on the common P-type substrate 50. Thus, the $N^+$ region 55 can be shared by the source of the MOS transistor 45 and the source of the MOS transistor 46. As a result, the layout area of the ESD protection circuit 24 (24-1, 24-2) can be reduced in the gate length direction.

In this example, two ESD protection circuits 24-1 and 24-2 are provided. In the case where the two ESD protection circuits 24-1 and 24-2 are provided, the drain of the MOS transistor 45 is shared. Hence, when the two ESD protection circuits 24-1 and 24-2 are juxtaposed, the layout area of the ESD protection circuit 24 (24-1, 24-2) can be reduced in the gate length direction.

[Modification 2]

Figure 9:
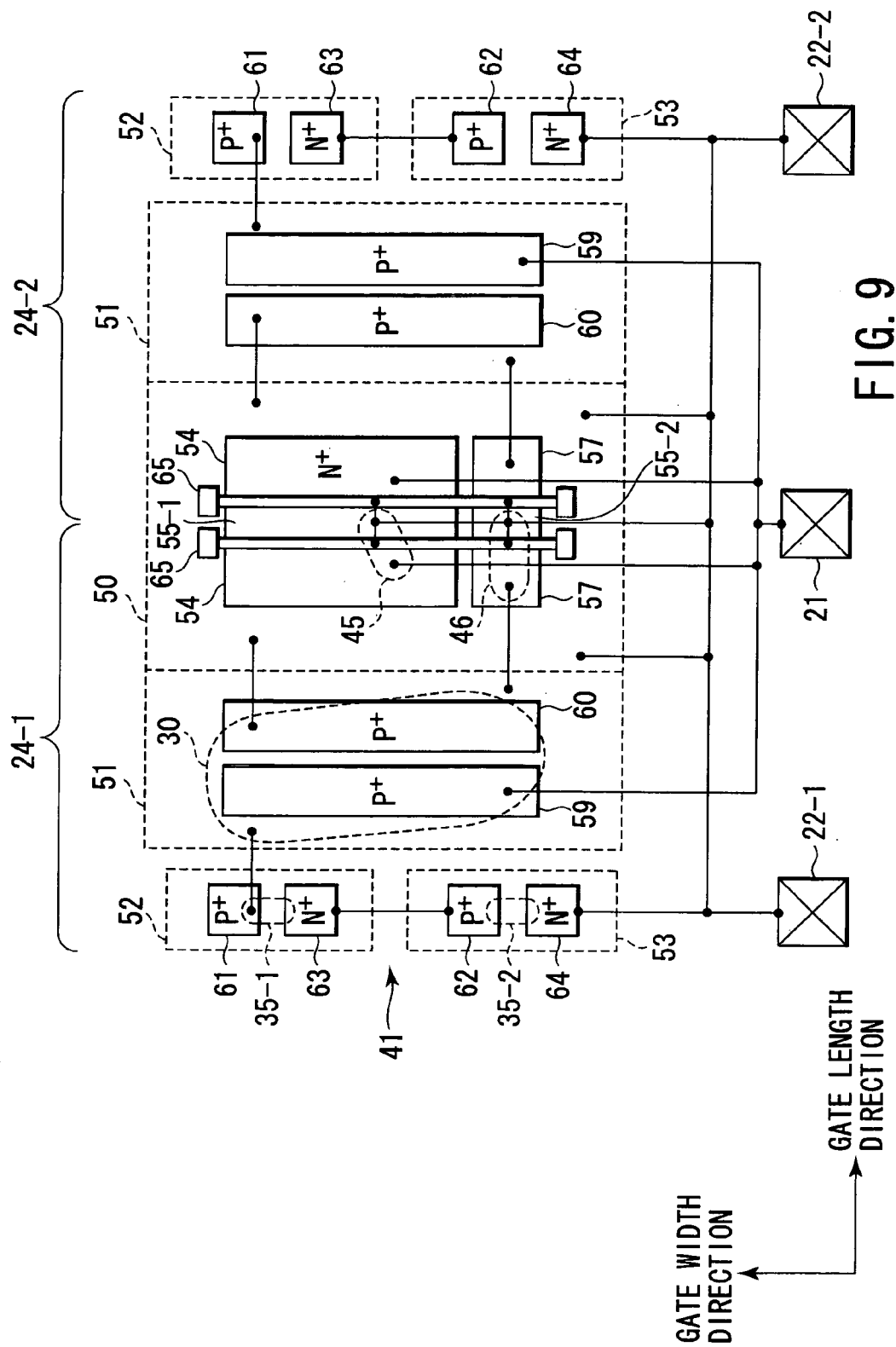
FIG. 9 shows a second layout of the ESD protection circuit shown in FIG. 7.

An ESD protection circuit according to Modification 2 will now be described referring to FIG. 9. FIG. 9 is a plan view illustrating an example of layout of the ESD protection circuit according to Modification 2. In this example of layout, the circuit shown in FIG. 7 is arranged on an LSI. In the description below, the parts common to those of Modification 1 are not described, and different parts are described in detail.

As is shown in FIG. 9, the pattern layout according to Modification 2 differs from that of Modification 1 in that the MOS transistors 45 and 46 are juxtaposed not in the gate length direction, but in a gate width direction that is perpendicular to the gate length direction.

A single gate electrode 65 is shared by the gate of the MOS transistor 45 and the gate of the MOS transistor 46. In this way, the MOS transistors 45 and 46 are juxtaposed in the gate width direction. Compared to Modification 1, the layout area in the gate length direction can further be reduced.

In this example, like Modification 1, two ESD protection circuits 24-1 and 24-2 are provided. According to Modification 2, not the drain 54 but the source 55 (55-1) of the MOS transistor 45 is shared. As regards the MOS transistor 46, the source 55 (55-2) is shared. Thereby, when the two ESD protection circuits are provided, the source 55-1 of the MOS transistor 45 and the source 55-2 of the MOS transistor 46 can be shared, and the layout area in the gate length direction can be reduced.

The operation of the ESD protection circuit according to Modification 2 is the same as that of the second embodiment, and a description thereof is omitted here.

As has been described above, according to the structures of the semiconductor IC devices of the embodiments and modifications of the present invention, the switching element releases ESD voltage by the bipolar operation. For example, compared to the thyristor operation, the on-state resistance can be decreased. Further, ESD voltage can be released by even a single switching element. Furthermore, since it should suffice if the control circuit detects ESD voltage and outputs such a control signal as to render the switching element conductive, there is no need to increase the size in order to produce a sufficient current. Therefore, the switching element and control circuit can be reduced in size, and the size of the entirety of the semiconductor IC device can be reduced.

As a result, it is possible to provide a semiconductor integrated circuit device with an ESD protection circuit that can reduce on-state resistance and can reduce the chip size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a semiconductor integrated circuit formed in a semiconductor chip;
   a switching element that is formed in the semiconductor chip and has a current path whose one end and the other end are both connected to the semiconductor integrated circuit, the switching element receiving a control signal and causing a current to flow from said one end to the other end of the current path by a bipolar operation; and a control circuit that is formed in the semiconductor chip and configured to control a conductive/non-conductive state of the current path of the switching element, the control circuit producing, when a voltage across both ends of the current path exceeds a predetermined voltage value, the control signal that renders the current path of the switching element conductive, and rendering the current path of the switching element non-conductive when the voltage across both ends of the current path does not exceed the predetermined voltage value;

wherein said switching element is a bipolar transistor that has one of a collector and an emitter, which corresponds to said one end of the current path, the other of the collector and the emitter, which corresponds to the other end of the current path, and a base tat receives the control signal.

2. A semiconductor integrated circuit device comprising:

a semiconductor integrated circuit formed in a semiconductor chip;

a switching element that is formed in the semiconductor chip and has a current path whose one end and the other end are both connected to the semiconductor integrated circuit, the switching element receiving a control signal and causing a current to flow from said one end to the other end of the current path by a bipolar operation; and a control circuit that is formed in the semiconductor chip and configured to control a conductive/non-conductive state of the current path of the switching element, the control circuit producing, when a voltage across both ends of the current path exceeds a predetermined voltage value, the control signal that renders the current oath of the switching element conductive, and rendering the current path of the switching element non-conductive when the voltage across both ends of the current path does not exceed the predetermined voltage value;

wherein said switching element is an insulated-gate field-effect transistor that has one of a source and a drain, which corresponds to said one end of the current pat, the other of the source and the drain, which corresponds to the other end of the current path, and a backgate that receives the control signal.

3. A semiconductor integrated circuit device comprising:

a semiconductor integrated circuit formed in a semiconductor chip;

a switching element that is formed in the semiconductor chip and has a current path whose one end and the other end are both connected to the semiconductor integrated circuit, the switching element receiving a control signal and causing a current to flow from said one end to the other end of the current path by a bipolar operation; and a control circuit that is formed in the semiconductor chip and configured to control a conductive/non-conductive state of the current path of the switching element, the control circuit producing, when a voltage across both ends of the current path exceeds a predetermined voltage value, the control signal that renders the current path of the switching element conductive, and rendering the current path of the switching element non-conductive when the voltage across both ends of the current path does not exceed the predetermined voltage value;

wherein the control circuit includes a trigger circuit that detects a state in which the voltage across both ends of the current path exceeds the predetermined voltage value, and outputs a trigger signal, and a thyristor circuit that outputs the control signal on the basis of the trigger signal.

4. The semiconductor integrated circuit device according to claim 3, wherein one end of the trigger circuit is connected to the other end of the current path, and the other end of the trigger circuit is connected to the base of the thyristor circuit, and one of a cathode and an anode of the thyristor circuit is connected to said one end of the current path, and the other of the cathode and the anode of the thyristor circuit is connected to the other end of the current path.

5. The semiconductor integrated circuit device according to claim 4, wherein the entirety of the thyristor circuit comprises bipolar transistors, and the switching element comprises a first bipolar transistor.

6. The semiconductor integrated circuit device according to claim 4, wherein at least a part of the thyristor circuit comprises an insulated-gate field-effect transistor, and the switching element comprises a first insulated-gate field-effect transistor.

7. The semiconductor integrated circuit device according to claim 4, wherein the thyristor circuit includes:

a first bipolar transistor having one of an emitter and a collector connected to said one end of the current path, and a second bipolar transistor having one of an emitter and a collector connected to the other end of the current path, the other of the emitter and the collector connected to a base of the first bipolar transistor, and a base connected to the other of the emitter and the collector of the first bipolar transistor, and wherein the trigger signal is supplied to a connection node between the base of the first bipolar transistor and the other of the emitter and the collector of the second bipolar transistor, and the control signal is output from a node between the other of the emitter and the collector of the first bipolar transistor and the base of the second bipolar transistor.

8. The semiconductor integrated circuit device according to claim 4, wherein the thyristor circuit includes a first bipolar transistor having one of an emitter and a collector connected to said one end of the current path, and a first insulated-gate field-effect transistor having one of a source and a drain connected to the other end of the current path, the other of the source and the drain connected to the base of the first bipolar transistor, and a backgate connected to the other of the emitter and the collector of the first bipolar transistor, and the trigger signal is supplied to a connection node between the base of the first bipolar transistor and the other of the source and the drain of the first insulated-gate field-effect transistor, and the control signal is output from a node between the other of the emitter and the collector of the first bipolar transistor and the backgate of the first insulated-gate field-effect transistor.

9. The semiconductor integrated circuit device according to claim 7, wherein the thyristor circuit further includes a resistor element having one end connected to said connection node between the other of the emitter and the collector of the first bipolar transistor and the base of the second bipolar transistor, and having the other end connected to the other end of the current path.

10. The semiconductor integrated circuit device according to claim 8, wherein the thyristor circuit further includes a resistor element having one end connected to said connection node between the other of the emitter and the collector of the first bipolar transistor and the backgate of the first insulated-gate field-effect transistor, and having the other end connected to the other end of the current path.

11. The semiconductor integrated circuit device according to claim 4, wherein the trigger circuit includes a diode having an anode and a cathode connected between the thyristor circuit and the other end of the current path, and the trigger signal is a forward current of the diode.

12. The semiconductor integrated circuit device according to claim 4, wherein the trigger circuit includes a diode-connected insulated-gate field-effect transistor having one of a source and a drain, which is connected to the thyristor circuit, the other of the source and the drain connected to the other end of the current path, and a gate, and the trigger signal is a forward current of the diode-connected insulated-gate field-effect transistor.

13. The semiconductor integrated circuit device according to claim 8, wherein said one end of the current path of the switching element corresponds to a first semiconductor region of a second conductivity type, which is formed in a semiconductor substrate of a first conductivity type, and the other end of the current path corresponds to a second semiconductor region of the second conductivity type, which is formed in the semiconductor substrate, and the other of the source and the drain of the first insulated-gate field-effect transistor corresponds to a third semiconductor region of the second conductivity type, which is formed in the semiconductor substrate, and said one of the source and the drain of the first insulated-gate field-effect transistor is shared with the second semiconductor region.

14. The semiconductor integrated circuit device according to claim 8, wherein said one end of the current path of the switching element corresponds to a first semiconductor region of a second conductivity type, which is formed in a semiconductor substrate of a first conductivity type, the other end of the current path corresponds to a second semiconductor region of the second conductivity type, which is formed in the semiconductor substrate, and the switching element has a gate electrode formed on that part of the semiconductor substrate, which is sandwiched between the first and second semiconductor regions, and one of the source and the drain of the first insulated-gate field-effect transistor corresponds to a third semiconductor region of the second conductivity type, which is formed in the semiconductor substrate, the other of the source and the drain of the first insulated-gate field-effect transistor corresponds to a fourth semiconductor region of the second conductivity type, which is formed in the semiconductor substrate, and a gate electrode of the first insulated-gate field-effect transistor is shared with the gate electrode of the switching element.

15. The semiconductor integrated circuit device according to claim 7, wherein the first bipolar transistor is disposed on a first well region of a second conductivity type, which is formed adjacent to a peripheral part of the switching element and the trigger circuit is disposed on a second well region of the second conductivity type, which is formed adjacent to a peripheral part of the first well region.

16. The semiconductor integrated circuit device according to claim 8, wherein the first bipolar transistor is disposed on a first well region of a second conductivity type, which is formed adjacent to a peripheral part of the switching element, and the trigger circuit is disposed on a second well region of the second conductivity type, which is formed adjacent to a peripheral part of the first well region.

* * * * *